United States Patent [19]

Thompson et al.

[11] Patent Number: 4,623,803
[45] Date of Patent: Nov. 18, 1986

[54] LOGIC LEVEL TRANSLATOR CIRCUIT FOR INTEGRATED CIRCUIT SEMICONDUCTOR DEVICES HAVING TRANSISTOR-TRANSISTOR LOGIC OUTPUT CIRCUITRY

[75] Inventors: Michael D. Thompson, Scotts Valley; Nikhil C. Mazumder, San Jose, both of Calif.

[73] Assignee: Advanced Micro Devices, Inc., Sunnyvale, Calif.

[21] Appl. No.: 550,263

[22] Filed: Nov. 8, 1983

[51] Int. Cl.$^4$ ............... H03K 19/013; H03K 19/092; H03K 17/04; H03K 17/60
[52] U.S. Cl. .................................... 307/475; 307/443; 307/456; 307/254
[58] Field of Search .............. 307/445, 446, 456, 457, 307/458, 475, 280, 299 A, 300, 544, 549, 559, 592, 270, 200 A, 254

[56] References Cited

U.S. PATENT DOCUMENTS

| | | | |
|---|---|---|---|
| 3,641,368 | 2/1972 | Gamble et al. | 307/456 |
| 4,339,675 | 7/1982 | Ramsey | 307/458 X |
| 4,355,246 | 10/1982 | Usui | 307/456 |
| 4,467,223 | 8/1984 | Neely | 307/456 X |
| 4,476,403 | 10/1984 | Allen | 307/475 |

Primary Examiner—Stanley D. Miller
Assistant Examiner—David R. Bertelson
Attorney, Agent, or Firm—J. Vincent Tortolano; Patrick T. King

[57] ABSTRACT

An improved logic level translator circuit for translating logic signals of non-TTL circuits to logic signals of TTL circuits is presented. The translator circuit as presented includes circuitry for providing elimination of noise spiking and the resultant erroneous switching caused by simultaneous conduction of TTL circuit outputs as they change states.

5 Claims, 2 Drawing Figures

LOGIC LEVEL TRANSLATOR CIRCUIT FOR INTEGRATED CIRCUIT SEMICONDUCTOR DEVICES HAVING TRANSISTOR-TRANSISTOR LOGIC OUTPUT CIRCUITRY

BACKGROUND OF THE INVENTION

1. Field of the Invention

The present invention relates to semiconductor devices that utilize transistor-transistor logic (TTL) output circuitry in combination with internal non-TTL circuitry. More particularly, the present invention relates to an improved logic level translator for eliminating the large surge currents which occur during switching causing large power supply transients that add considerably to the noise generated by the translator circuit.

2. Description of the Prior Art

Several families of logic circuits are available for use in implementing the logic functions central to the operation of high speed computers and digital equipment. These logic circuit families differ in circuit characteristics such as speed of operation, logic levels, noise immunity (noise margin), power dissipation and fan-out capability. Development of logic circuitry has evolved from the first logic family designs - resistor-transistor logic (RTL) and diode-transistor logic (DTL) - to transistor-transistor logic (TTL), emitter-coupled logic (ECL) and integrated-injection logic ($I^2L$) circuit designs, with each step in this evolution bringing faster switching speeds, lower power dissipation and greater noise immunity. The superior switching speed of the later designs (TTL and ECL) has made the RTL and DTL families obsolete.

The continuing effort to reduce switching speeds led to the development and use of the Schottky Diode, which has a lower forward voltage at a given current level than the conventional diffused (p-n) diode. The Schottky diode also has a lower storage time, hence a lower fall time, and thus it is inherently faster than a conventional diode. Using Schottky diodes as clamps on individual transistors (connected from base to collector) prevents heavy transistor saturation caused by excess charge stored in the transistor's base region, thus reducing switching delay. In this manner, the Schottky TTL design achieves greater switching speed with no increase in power dissipation over standard TTL.

Additional design techniques, such as increasing resistance and adding a Darlington booster stage to the TTL output, provide a reduction in power dissipation. However, this decrease in power dissipation is accompanied by an increase in propagation delay.

The combination of low-power technology and Schottky clamping resulted in the low-power Schottky TTL integrated circuit, now firmly established as a standard logic configuration for high performance systems. For applications in which speed and low power are critical, low-power Schottky TTL gives the lowest product of propagation delay and power dissipation (speed-power product) of any of the TTL variations.

Low-power gates have the further advantage of increased fan out capability over standard gates, ie., a greater number of gate inputs can be driven by a lower power gate output, without affecting its logic level output.

Further improvements in switching speed were achieved with the development of the emitter-coupled logic (ECL) circuit. ECL is a form of current-mode logic, i.e., logic in which unsaturated transistors operate from a constant current source that is switched at very high speed from one transistor to another. The basic ECL structure is configured such that the emitters of two transistors are connected to a single current-carrying resistor in such a way that only one transistor conducts at a time. The logic state of the output depends on which transistor is conducting. The ECL design eliminates transistor saturation in order to increase switching speed. An ECL circuit requires a relatively small logic swing (output voltage change between high and low logic levels) which also contributes to greater switching speed. For applications in which very high switching speed is the sole critical parameter, ECL excels over all other configurations.

In addition to switching speed and power dissipation, noise margin is another circuit characteristic which is an important design consideration. Excessive noise on a supply bus line or a ground bus line of an integrated circuit device could affect the input of an internal logic circuit, temporarily causing that circuit to change states, resulting in an erroneous output. Noise margin is essentially a measure of the maximum noise voltage tolerable at the gate input to guarantee preclusion of false switching. Specifically, noise margin is defined as the voltage difference between the guaranteed DC output voltage of a particular logic circuit and its worst-case input threshold voltage (i.e., the minimum input voltage required to produce said guaranteed output voltage). Thus, it is apparent that noise margin is related to the difference between the high and low logic levels of a particular circuit. This difference, termed the logic swing, is defined as the difference between the logical-HIGH output voltage and the logical-LOW output voltage. Therefore, the smaller the logic swing is, the smaller the noise margin will be.

To maximize system performance, circuits from different logic families can be used in combination, with each circuit being selected according to its intended function considered in conjunction with its performance characteristics. In pulse-counting applications, for example, ECL circuits can be used in the initial counting stages where high speed is necessary. Once the frequency is divided it is economical to use slower logic circuits for the lowerspeed counting states. However, since TTL has become the industry standard for input-/output compatability of integrated circuit devices, TTL circuits must be placed at the inputs and outputs of any internal non-TTL circuitry used within an integrated circuit. Furthermore, because different logic families have different logic levels, interface circuitry is required when circuits from different logic families are interconnected. Noise problems, however, have been encountered with such configurations. More specifically, the TTL output stage of the interface ("translator") circuitry generates noise pulses ("spikes") when switching, which can cause erroneous state changes by the non-TTL circuit to which the translator circuit is connected.

SUMMARY OF THE INVENTION

An object of the present invention is to eliminate noise generated on the voltage supply and ground bus lines in an integrated circuit semiconductor device where such noise is caused by simultaneous conduction of first and second output transistors in Transistor-Transistor Logic (TTL) gates, which results in unintended switching and therefore false logical output from another logic circuit connected to the TTL gate.

Another object of the present invention is to speed up the switching of the first TTL output transistor.

Still another object of the present invention is to speed up the switching of a second input-stage transistor.

The present invention typically has application in integrated circuit semiconductor devices which utilize logic circuits from different logic families together in one system. Because logic levels differ among the various logic families, it is necessary in virtually all applications to use interface circuitry to convert from one set of logic levels to another. Interlevel converters for use between some of the more popular logic types are a standard feature of many of today's integrated circuit packages (Advanced Micro Devices Am2900 family, for example).

The improved logic level translator circuit of the present invention includes: an input-stage circuit; an output-stage circuit, which includes a phasesplitting transistor, and first and second TTL output transistors, and a Darlington transistor in a Darlington output circuit configuration; circuit means for turning off the second TTL output transistor before the first TTL output transistor begins to turn on; circuit means for speeding up the switching of the first TTL output transistor; and circuit means for speeding up the switching of a second input-stage transistor.

The input-stage circuit includes: a signal source means for providing an output signal in response to signals received from a non-TTL circuit, where the signal source means includes first and second input-stage transistors coupled in such a way as to form a current-mirror circuit; an input transistor for receiving a signal from the signal source means and for causing the phasesplitting transistor to switch on and switch off in accordance with the signal received by the input transistor from the signal source means; and a high threshold input circuit which includes first, second and third diode elements.

The circuit means for turning off the second TTL output transistor before the first TTL output transistor begins to turn on includes a cut-off transistor which is coupled to the output of the signal source means and is further coupled to the second TTL output transistor, such that the cut-off transistor causes the second TTL output transistor to shut off before the first TTL output transistor begins to turn on, when a logic-HIGH signal is provided by the signal source means (i.e., a low-to-high transition of the translator circuit).

The circuit means for speeding up the switching of the first TTL output transistor includes first, second, third and fourth charging resistors, and first, second and third resistance elements, configured such that the first TTL output transistor is caused to turn off before the second TTL output transistor begins to turn on, in a high-to-low transition of the translator circuit, and the first TTL output transistor is caused to turn on faster, once the second TTL output transistor has been turned off, in a low-to-high transition of the translator circuit.

The circuit means for speeding up the switching of the second input-stage transistor includes first and second speed-up transistors which are coupled to the second input-stage transistor, and are further coupled to the input transistor, such that the first and second speed-up transistors operate to prevent the second input-stage transistor from saturating during a logic-HIGH to logic-LOW transition of the translator circuit.

An advantage of the present invention is elimination of the noise spiking on power supply and ground buses caused by simultaneous conduction of the first and second TTL output transistors in the TTL output-stage. This eliminates fatal errors resulting from erroneous state changes by the non-TTL circuit in response to such noise spikes.

Another advantage of the present invention is the circuit's increased operating efficiency due to the elimination of the conventional squaring circuit used to increase the rate at which the second TTL output transistor is turned off. Replacing the squaring circuit with a single cut-off transisor reduces the power drain on the base terminal of the second TTL output transistor.

The increased efficiency of the translator circuit results in a further advantage of the present invention which is a reduction of dynamic power dissipation, which results in lower chip temperature at high operating frequency.

A further advantage of the present invention is elimination of the effects of the Miller capacitane common to inverting amplifiers.

Another advantage of the present invention is a reduction in testing problems due to the lower on-chip noise which requires less compensation for reliable testing.

A final advantage of the present invention is that design considerations for maximum power applications are simplified. The necessity of employing more expensive and less efficient methods to compensate for noise spiking—such as separate power pins or separate power supply and ground bus lines—is eliminated.

DETAILED DESCRIPTION OF A SPECIFIC EMBODIMENT

Reference is now made in detail to a specific embodiment of the present invention, which illustrates the best mode presently contemplated by the inventor for practicing the invention, the specific embodiment of which is set forth in an accompanying drawing.

Figure 1:
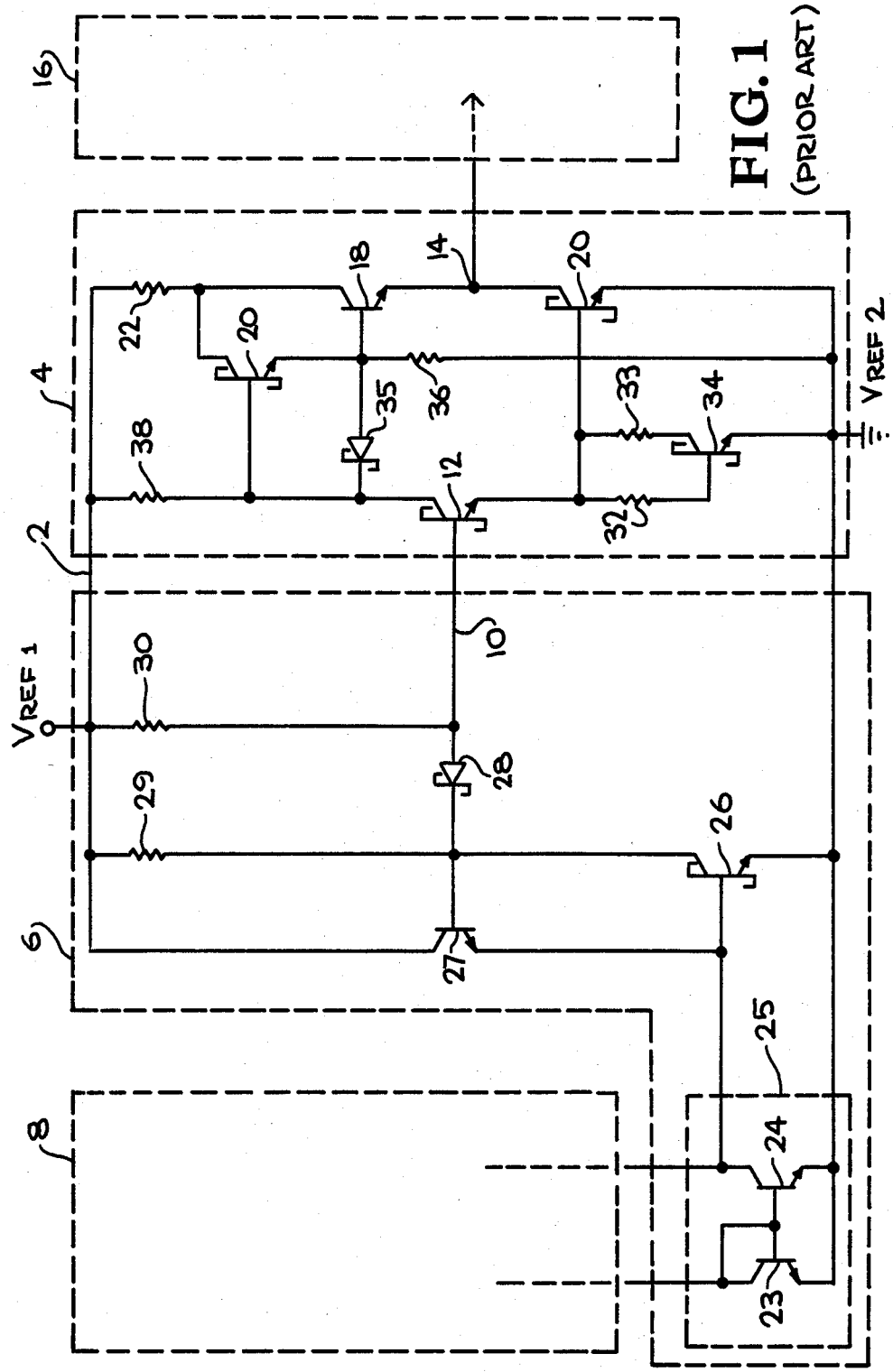
FIG. 1 is a schematic diagram of a conventional prior art non-TTL to TTL logic level translator.

FIG. 1 shows a prior art embodiment of a non-TTL (eg. ECL or I²L) to TTL translator circuit used to convert non-TTL output logic levels to TTL-compatible logic levels. Referring to FIG. 1, translator circuit 2 is essentially a Schottky TTL output gate 4 in conjunction with an input stage 6. In response to a signal from non-TTL circuit 8, input stage 6 produces a corresponding signal, on line 10, at the base of phase-splitting transistor 12. In conventional fashion, the TTL output gate 4 produces, on output terminal 14, a TTL-level logic signal which is inverted from the logic signal received by the output gate on line 10. Thus, a non-TTL level, logic-LOW output signal from non-TTL circuit 8 will cause a TTL-level, logic-HIGH output signal to be produced on output terminal 14, to be received as an input signal by TTL circuit 16.

The output signals of the TTL translator are produced by the switching of output transistors 18 and 20, which continually operate in opposite states. This switching of TTL output transistor 18 and TTL output transistor 20 is accomplished by phase-splitting transistor 12 which provides the base terminals of TTL output transistors 18 and 20 with voltages that swing in opposite directions. (A detailed description of the translator circuit operation, in a specific embodiment of the present invention, appears below).

The circuit configuration of the prior art translator is such that the rise time and fall time of the TTL output gate structure gains in significance as a design consideration. The rise time and fall time of the TTL gate structure are unequal. Therefore, during the high-to-low or low-to-high transition that occurs when the translator output changes state, both output transistor 18 and output transistor 20 are "on" for a brief period of time.

When both output transistors 18 and 20 are on simultaneously, a low impedance current path is created between $V_{REF1}$ and $V_{REF2}$. The only limit on the amount of current flowing from $V_{REF1}$ to $V_{REF2}$ is resistor 22, and the collector resistances of output transistor 18 and output transistor 20. These resistances are usually small (less than 100 ohms total) and the resulting current is large (greater than 50 milliamps). In a TTL gate with 8 to 16 outputs all switching at the same time the amount of current flowing from $V_{REF1}$ to $V_{REF2}$ can become excessive (greater than 1000 miliamps). These current pulses interacting with the line impedances causes a temporary drop in the power supply voltage available to other logic circuits within the integrated circuit device. If such a noise pulse or noise spike on the $V_{REF1}$ or $V_{REF2}$ lines exceeds the noise margin of non-TTL circuit 8, it can cause non-TTL circuit 8 to change states temporarily and thus, indicate a false logical output. This is an especially serious problem when the non-TTL circuit has a low noise margin. An ECL circuit, with its small logic swing and low noise margin characteristics is especially susceptible to noise spikes caused by translator circuit switching.

Figure 2:
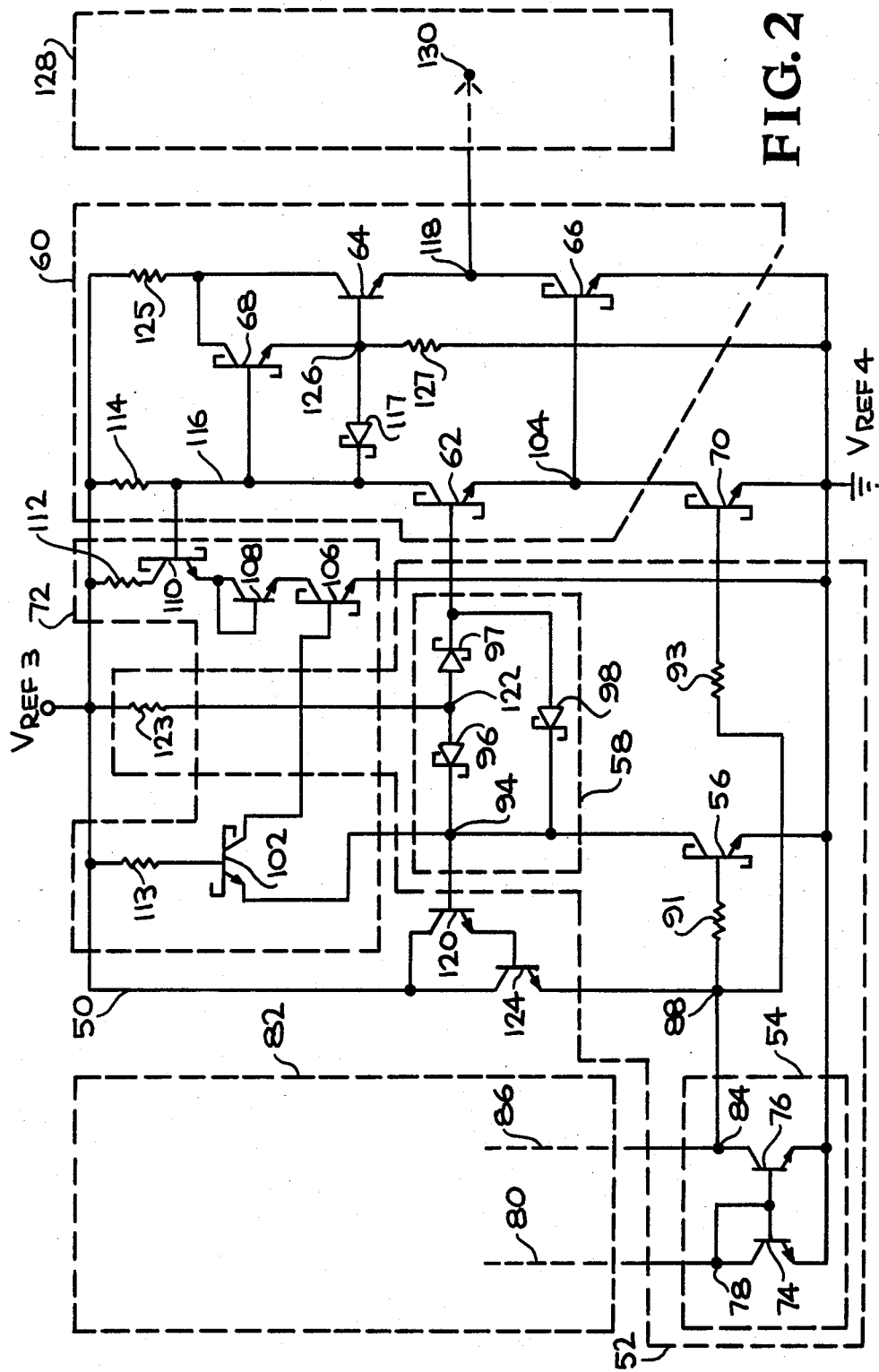
FIG. 2 is a schematic diagram illustrating a specific embodiment of a non-TTL to TTL logic level translator circuit according to the present invention.

FIG. 2 is a schematic diagram illustrating an improved logic level translator circuit 50 according to the present invention. Translator circuit 50 includes: an input-stage circuit 52, which includes a signal source means 54, an input transistor 56, and a high threshold input circuit diode cluster 58; an outputstage circuit 60, which includes a phase-splitting transistor 62, a first TTL output transistor 64, a second TTL output transistor 66, and a Darlington transistor 68 coupled to first TTL output transistor 64 in a Darlington output circuit configuration; a circuit means (cut-off transistor 70) for turning off second TTL output transistor 66, before first TTL output transistor 64 begins to turn on; a circuit means 72, for speeding up the switching of the first TTL output transistor 64; and a circuit means (transistor 120 and transistor 124) for speeding up the switching of an input-stage transistor 76. To increase the speed of translator circuit 50, Schottky diodes and transistors are emloyed throughout the configuration. Schottky circuit elements are inherently faster than their conventional counterparts.

First and second input-stage transistors 74 and 76 form the signal source means 54 in the configuration of a current mirror circuit. First and second input stage transistors 74 and 76 have their base terminals coupled together and their emitter terminals coupled to reference voltage terminal $V_{REF4}$, a ground potential. First input-stage transistor 74, connected as a diode, has its base terminal further coupled to its collector terminal. At terminal 78, the collector terminal of first input-stage transistor 74 is coupled to a first output line 80 from non-TTL circuit 82. At output terminal 84, the collector terminal of second input-stage transistor 76 is coupled to a second output line 86 from non-TTL circuit 82. The signal source means output terminal 84 is coupled, at node 88, to the base terminal of input transistor 56 (through resistor 91), to the base terminal of cut-off transistor 70 (through resistor 93), and to the emitter terminal of transistor 124.

Input transistor 56 has its emitter terminal coupled to reference voltage ground terminal $V_{REF4}$. The collector terminal of input transistor 56 is coupled, at node 94, to the base terminal of phase-splitting transistor 62 (through diode elements 96, 97 and 98), to the emitter terminal of transistor 102 and to the base terminal of transistor 120. Transistor 70 has its emitter terminal coupled to reference voltage ground terminal $V_{REF4}$. The collector terminal of cut-off transistor 70 is coupled at node 104 to the base terminal of second TTL output transistor 66 and to the emitter terminal of phase-splitting transistor 62. Upon receiving a logic-HIGH signal at its base terminal, cut-off transistor 70 operates to turn off second TTL output transistor 66.

Transistors 102, 106, 108 and 110 form circuit means 72 for speeding up the switching of the first TTL output transistor 64. Transistor 102 has its emitter coupled to the collector terminal of input transistor 56 at node 94.

The base terminal of transistor 102 is coupled to reference voltage supply terminal $V_{REF3}$ through resistor 113. Transistor 102 has its collector terminal coupled to the base terminal of transistor 106. The emitter terminal of transistor 106 is coupled to reference voltage ground terminal $V_{REF4}$ and the collector terminal of transistor 106 is coupled to the emitter terminal of transistor 108. The base and collector terminals of transistor 108 are coupled to the emitter terminal of transistor 110.

Transistor 110 has its collector terminal coupled to reference voltage supply terminal $V_{REF3}$, through resistor 112. The base terminal of transistor 110 is coupled to reference voltage supply terminal $V_{REF3}$, through resistor 114. The base terminal of transistor 110 is also coupled to the collector terminal of phase-splitting transistor 62, on a line 116, to which the base terminals of first TTL output transistor 64 and Darlington transistor 68 are also coupled.

Phase-splitting transistor 62 has its base terminal coupled, at node 94, to the collector terminal of input transistor 56 (through diode cluster 58). The collector terminal of phase-splitting transistor 62 is coupled to the base terminal of Darlington transistor 68, and is further coupled through diode element 117 to the base terminal of first TTL output transistor 64. The collector terminal of phase-splitting transistor 62 is also coupled to the base terminal of transistor 110, and to reference voltage supply terminal $V_{REF3}$ (through resistor 114). The emitter terminal of phase-splitting transistor 62 is coupled to the base terminal of second TTL output transistor 66 and to the collector terminal of cut-off transistor 70. Phase-splitting transistor 62 operates to control the output voltage at output node 118.

Diode cluster 58 forms a high threshold input circuit with diode elements 96, 97 and 98 coupled between node 94 and the base terminal of phasesplitting transistor 62. Node 94 couples the collector terminal of input transistor 56, the base terminal of speed-up transistor 120, the emitter terminal of transistor 102 and the base terminal of phase-splitting transistor 62. Diode cluster 58 is also coupled at node 122 to reference voltage supply terminal $V_{REF3}$ (through resistor 123).

First and second speed-up transistors 120 and 124 operate together to increase the switching speed of second input-stage transistor 76. First speed-up transistor 120 has its base terminal coupled to the collector terminal of input transistor 56. The collector terminal of first speed-up transistor 120 is coupled to the collector terminal of second speed-up transistor 124. The emitter terminal of first speed-up transistor 120 is coupled to the base terminal of second speed-up transistor 124.

Second speed-up transistor 124 has its collector terminal coupled to reference voltage supply terminal $V_{REF3}$. The emitter terminal of second speed-up transistor 124 is coupled, at node 88, to the collector terminal of second input-stage transistor 76.

Transistors 64 and 66 are the "totem-pole" TTL output transistors of the translator circuit. When first TTL output transistor 64 and Darlington transistor 68 are "on" they combine to perform the "pullup" function by providing current to output node 118 from a higher level reference voltage $V_{REF3}$ (relative to lower level reference voltage $V_{REF4}$). This higher level reference voltage at output node 118 corresponds to a binary ONE (logic-HIGH output). First TTL output transistor 64 has its base terminal coupled, through diode element 117, to the collector terminal of phase-splitting transistor 62 (line 116). The collector terminal of first TTL output transistor 64 is coupled to reference voltage supply terminal $V_{REF3}$, through current limiting resistor 125. The emitter terminal of first TTL output transistor 64 is coupled to the collector terminal of second TTL output transistor 66 and together the emitter terminal of first TTL output transistor 64 and the collector terminal of second TTL output transistor 66 are coupled to output node 118.

Darlington transistor 68 serves to prevent first TTL output transistor 64 from being turned on when the output node 118 is at a low level and second TTL output transistor 66 is saturated. Darlington transistor 68 has its base terminal coupled to the collector terminal of phase-splitting transistor 62. The collector terminal of Darlington transistor 68 is coupled to the collector terminal of first TTL output transistor 64. The emitter terminal of Darlington transistor 68 is coupled, at node 126, to the base terminal of first TTL output transistor 64 and to reference voltage ground terminal $V_{REF4}$ (through resistor 127).

When second TTL output transistor 66 is "on" it performs the "pulldown" function of the translator circuit by providing a current path to a lower level reference voltage $V_{REF4}$, which pulls output node 118 down to a binary ZERO (logical-LOW output). The base terminal of second TTL output transistor 66 is coupled, at node 104, to the emitter terminal of phase-splitting transistor 62 and to the collector terminal of cut-off transistor 70. The emitter terminal of second TTL output transistor 66 is coupled to reference voltage ground terminal $V_{REF4}$. Second TTL output transistor 66 has its collector terminal coupled to the emitter terminal of first TTL output transistor 64 at output node 118.

The operation of translator circuit 50 is as follows: Complementary (LOW and HIGH, or HIGH and LOW) output signals, produced on lines 80 and 86 by non-TTL circuit 82, cause the input-stage transistors of signal source means 54 to source current to, or sink current from, node 88.

When a low-level voltage (a binary ZERO) from non-TTL circuit 82 is received by signal source means 54, second input-stage transistor 76 is in a low conduction state. Under this condition, signal source means 54 will source current to the base terminals of input transistor 56 and cut-off transistor 70, through resistors 91 and 93, respectively. Input transistor 56 and cut-off transistor 70 are turned on by the high-level voltage at their base terminals and both transistors saturate quickly. When cut-off transistor 70 saturates, it turns off second TTL output transistor 66. At this point, the other (first) TTL output transistor 64 has not yet begun to turn on, so there is no chance that both TTL output transistors 64 and 66 will be on at the same time during a low-to-high transition of the translator circuit's output stage. This eliminates the noise spike and resultant erroneous switching caused by such simultaneous conduction. Furthermore, the operation of quickly turning off second TTL output transistor 66 following receipt of a high-level input signal effectively eliminates any effects of the Miller capacitance on the second TTL output transistor 66. When input transistor 56 is turned on by the high level voltage at its base terminal, it sinks current from the base terminal of phase-splitting transistor 62, causing phase-splitting transistor 62 to turn off. However, due to the addition of diode elements 97 and 98, the high threshold input circuit operates to delay the turning off of phase-splitting transistor 62, insuring that second TTL output transistor 66 has been turned off (by cut-off transistor 70) before phase-splitting transistor 62 can operate to turn on the other (first) TTL output transistor 64.

When phase-splitting transistor 62 turns off, the voltage on its collector begins to rise toward a $V_{REF3}$ voltage level. At this point, Darlington transistor 68 and first TTL output transistor 64 begin to turn on due to the rise in voltage at their base terminals produced by the rise in voltage at the collector terminal of phase-splitting transistor 62.

Since second TTL output transistor 66 is already turned off, it is desirable to have the voltage at the collector of phase-splitting transistor 62 rise as quickly as possible, to turn on Darlington transistor 68 and first TTL output transistor 64, thereby producing an output voltage at output node 118 as quickly as possible. Circuit means 72 (transistors 102, 106, 108, 110, resistors 112, 113, 114) is provided for speeding up the rise in voltage at the collector terminal of phase-splitting transistor 62. When input transistor 56 saturates due to the high-level voltage at its base terminal, it causes transistor 102 to turn on. When transistor 102 is conducting, it sinks current from the base terminal of transistor 106, causing transistor 106 to turn off. With transistor 106 off, as the voltage on the collector of phase-splitting transistor 62 rises, the capacitances associated with transistor 110 (except base capacitance), transistor 108 and transistor 106 are charged through resistor 112 by transistor 110. This increases the rate of rise of the collector voltage of phase-splitting transistor 62, and thus compensates for the delayed shut-off of phase-splitting transistor 62 caused by the high threshold input circuit (diode cluster 58).

When Darlington transistor 68 and first TTL output transistor 64 are turned on by the high-level voltage on the collector terminal of phase-splitting transistor 62, first TTL output transistor 64 conducts current from reference voltage supply terminal $V_{REF3}$ to output terminal 118. The voltage level at output terminal 118 moves toward the high-level voltage of $V_{REF3}$, generating a binary ONE, which is received by TTL circuit 128 at input node 130.

When a high-level voltage (a binary ONE) from non-TTL circuit 82 is received by signal source means 54, second input-stage transistor 76 is in a high conduction state. Under this condition, signal source means 54 will sink current from the base terminals of input transistor 56 and cut-off transistor 70, causing input transistor 56 and cut-off transistor 70 to turn off. At this point, current will be flowing into signal source means 54, being drawn from the base terminals of input transistor 56 and cut-off transistor 70 through resistors 91 and 93 respectively.

With input transistor 56 turned off, the voltage on its collector terminal will begin to rise, shutting off transistor 102. When transistor 102 turns off, current will flow from resistor 113 through the Schottky clamp of transistor 102 to the base terminal of transistor 106, turning it on. This occurs when the voltage on the collector terminal of input transistor 56 has risen to a level equal to $V_{SD}\text{-}V_{SAT}$, where $V_{SAT}$ is the saturation voltage of input transistor 56, and $V_{SD}$ is the voltage of the Schottky diode on transistor 102.

As transistor 106 turns on, current is drawn through transistors 108 and 110. Transistor 110 quickly saturates because of resistor 112. At this point, current begins to flow through the Schottky clamp and the base-emitter junction of transistor 110. This current being drawn through resistor 114 causes the voltage on the collector terminal of phase-splitting transistor 62 to drop, turning off Darlington transistor 68 and first TTL output transistor 64. Since phase-splitting transistor 62, and thus, second TTL output transistor 66 are still off, there is no possibility that both TTL output transistors will be on at the same time during a high-to-low transition of the translator circuit's output stage. Therefore, no low impedance path from supply to ground is created, precluding the possibility of noise spiking on the supply and ground buses.

The final phase of the high-to-low transition occurs when the voltage at the collector terminal of input transistor 56 has risen high enough to turn on phase-splitting transistor 62. This occurs at a base-emitter voltage of about $2V_{BE}\text{-}V_{SAT}$, where $V_{BE}$ is the voltage at the base-emitter junctions of phase-splitting transistor 62 and second TTL output transistor 66, and $V_{SAT}$ is the saturation voltage of these two transistors. Note that the high threshold input circuit (diode cluster 58) operates to prevent phase-splitting transistor 62, and hence, second TTL output transistor 66, from turning on before first TTL output transistor 64 has turned off.

It is clear from the discussion thus far, that the operation of second input-stage transistor 76 is central to the total operation of the present invention because of the function second input-stage transistor 76 provides as the link between non-TTL circuit 82 and translator circuit 50. Because second input-stage transistor 76 is responsible for initiating each operational cycle of translator circuit 50, in response to each change in state by non-TTL circuit 82, it is desirable to cause second input-stage transistor 76 to operate as fast and as efficiently as possible. Together, first speed-up transistor 120 and second speedup transistor 124 perform such a function in the translator circuit.

First and second speed-up transistors 120 and 124 operate together to increase the switching speed of second input-stage transistor 76. When second input-stage transistor 76 is in a high conduction state, it sinks current from translator circuit 50 (from node 88). Second input-stage transistor 76, in sinking current from the base terminals of input transistor 56 and cut-off transistor 70, causes input transistor 56 and cut-off transistor 70 to turn off. When input transistor 56 is turned off, the voltage on its collector terminal rises. The base terminal of first speed-up transistor 120 is coupled, at node 94, to the collector terminal of input transistor 56, so that the rise in voltage on the collector terminal of input transistor 56 causes first speed-up transistor 120 to turn on. The emitter terminal of first speed-up transistor 120 is coupled to the base terminal of second speed-up transistor 124, and together, the collector terminals of these two transistors are coupled to reference voltage supply terminal $V_{REF3}$. Thus, when first speed-up transistor 120 is turned on, it causes second speed-up transistor 124 to turn on.

The emitter terminal of second speed-up transistor 124 is coupled, at node 88, to the collector terminal of second input-stage transistor 76. Thus, when second speed-up transistor 124 is turned on, it delivers current to the collector terminal of second input-stage transistor 76. At this point, remember, second input-stage transistor 76 is in a high conduction state. However, the current being delivered by second speed-up transistor 124, to the collector terminal of second input-stage transistor 76, prevents the input-stage transistor from saturating. The result is that second input-stage transistor 76 will go to a low-conduction state faster, when a low-level voltage subsequently appears at its base terminal.

The present invention, as described in detail above, completely eliminates the noise spiking and resultant erroneous switching caused by simultaneous conduction of TTL-circuit output transistors as the output transistors change state. This eliminates the necessity of using other, more expensive and less efficient means to eliminate or reduce noise spiking and its related effects, such as providing separate power supplies which require additional pins on an integrated circuit chip, or providing separate supply bus lines and separate ground bus lines.

The foregoing description of a specific embodiment of the present invention has been presented for purposes of illustration and description. It is not intended to be exhaustive or to limit the invention to the precise form disclosed, and obviously many modifications and variations are possible in light of the above teaching. The embodiment was chosen and described in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto and their equivalents.

What is claimed is:

1. An improved logic translator circuit for translating between non-transistor-transistor logic (non-TTL) circuitry and transistor-transistor logic (TTL) circuitry, said translator circuit comprising:

an output-stage circuit including a phasesplitting transistor, having a collector terminal and an emitter terminal, and having a base terminal coupled to the non-TTL circuitry, said output-stage circuit including a first TTL output transistor having a collector terminal coupled to a reference voltage supply terminal, and a base terminal coupled to said collector terminal of said phase-splitting transistor, said output-stage circuit further including a second TTL output transistor having its base terminal coupled to the emiter terminal of the phase-splitting transistor, and having its emitter terminal coupled to a reference voltage ground terminal with an emitter terminal of the first TTL output transistor and a collector terminal of the second TTL output transistor being coupled to a TTL output terminal of said output-stage circuit;

a first circuit means, coupled to the non-TTL circuitry, and coupled to the base terminal of said second TTL output transistor, for turning off said second TTL output transistor before said first TTL output transistor begins to turn on, when the output terminal of said outputstage circuit is switching from a logic-LOW to a logic-HIGH state;

a second circuit means, coupled to the non-TTL circuitry, and further coupled to the base terminal of said first TTL output transistor, for speeding up the switching of said first TTL output transistor, said second circuit means providing that said first TTL output transistor is turned off before said second TTL output transistor begins to turn on when the output terminal of said output-stage circuit is switching from a logic-HIGH to a logic-LOW state, and said second circuit means providing that, once said second TTL output transistor is turned off, the turning-on of said first TTL output transistor is speeded up when the output terminal of said output-stage circuit is switching from a logic-LOW to a logic-HIGH state;

an input stage circuit having:
(a) signal source means for providing an output signal on an output terminal thereof, in response to a signal received from said non-TTL circuit, said signal source means including:
  (i) a first input-stage transistor having a collector terminal coupled to a first output terminal of said non-TTL circuit, a base terminal coupled to said collector terminal of said first input-stage transistor and an emitter terminal coupled to said reference voltage ground terminal; and
  (ii) a second input-stage transistor having a collector terminal coupled to a second output terminal of said non-TTL circuit, a base terminal coupled to said base terminal of said first input-stage transistor, and an emitter terminal coupled to said emitter terminal of said first input-stage transistor, such that said first and second inputstage transistors form a current mirror circuit;
(b) an input-transistor having a base terminal coupled to said output terminal of said signal source means, said base terminal of said input transistor being further coupled to said first circuit means, said input transistor also having an emitter terminal coupled to said reference voltage ground terminal and a collector terminal coupled through said second circuit means to said reference voltage supply terminal, and further coupled to the base terminal of said phase-splitting transistor, such that said input stage circuit couples said non-TTL circuit, through said first and second circuit means, to said output stage circuit; and
(c) a high threshold input circuit including:
  (i) a first input diode element with a cathode terminal coupled to said collector terminal of said input transistor and an anode terminal coupled to said reference voltage supply terminal;
  (ii) a second input diode element with an anode terminal connected to said reference voltage supply terminal and a cathode terminal coupled to the base terminal of said phase-splitting transistor; and
  (iii) a third input diode element with a cathode terminal coupled to said collector terminal of said input transistor and an anode terminal coupled to said base terminal of said phase-splitting transistor.

2. The circuit of claim 1, wherein said translator circuit includes circuit means for speeding up the switching of said second input-stage transistor.

3. The circuit of claim 2, wherein said circuit means for speeding up the switching of said second input-stage transistor includes:
(a) a first speed-up transistor having a collector terminal and an emitter terminal and having a base terminal coupled to the collector terminal of said input transistor; and
(b) a second speed-up transistor having a base terminal coupled to the emitter terminal of said first speed-up transistor, a collector terminal coupled to the collector terminal of said first speed-up transistor, said collector terminals of said first and second speed-up transistors being further coupled to said reference voltage supply terminal, and said second speed-up transistor having an emitter terminal coupled to the collector terminal of said second input-stage transistor.

4. The circuit of claim 1, wherein said first circuit means for turning off said second TTL output transistor before said first TTL output transistor begins to turn on includes a cut-off transistor, said cut-off transistor having a base terminal coupled to said output terminal of said signal source means, an emitter terminal coupled to said reference voltage ground terminal, and a collector terminal coupled to the base terminal of said second TTL output transistor, such that said cut-off transistor causes said second TTL output transistor to shut off before said first TTL output transistor begins to turn on, when a logic-HIGH signal is produced on said output terminal of said signal source means.

5. The circuit of claim 1, wherein said second circuit means for speeding up the switching of said first TTL output transistor includes first, second, third and fourth charging transistors, each said charging transistor having a base terminal, an emitter terminal, and a colelctor terminal, such that:
(a) said first charging transistor has its base terminal coupled through a first resistance element to said reference voltage supply terminal, its emitter terminal coupled to said collector terminal of said input transistor, and its collector terminal coupled to said base terminal of said second charging transistor;
(b) said second charging transistor has its base terminal coupled to said collector terminal of said first-charging transistor, its emitter terminal coupled to said reference voltage ground terminal, and its collector terminal coupled to said emitter terminal of said third charging transistor;
(c) said third charging transistor has its base terminal coupled to its collector terminal, and has both its base terminal and its collector terminal coupled to said emitter terminal of said fourth charging transistor, and has its emitter terminal coupled to said collector terminal of said second charging transistor; and (d) said fourth charging transistor has its base terminal coupled to said collector terminal of said phase-splitting transistor, and further coupled, through a second resistance element, to said reference voltage supply terminal, said fourth charging transistor further having its emitter terminal coupled to the collector terminal and the base terminal of said third charging transistor, and said fourth charging transistor further having its collector terminal coupled, through a third resistance element, to said reference voltage supply terminal.

* * * * *